(12) United States Patent
Li et al.

(10) Patent No.: US 11,380,613 B2
(45) Date of Patent: Jul. 5, 2022

(54) REPURPOSED SEED LAYER FOR HIGH FREQUENCY NOISE CONTROL AND ELECTROSTATIC DISCHARGE CONNECTION

(71) Applicant: QUALCOMM Incorporated, San Diego, CA (US)

(72) Inventors: Yue Li, San Diego, CA (US); Li-Sheng Weng, San Diego, CA (US); Yangyang Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 16/888,516

(22) Filed: May 29, 2020

(65) Prior Publication Data

US 2021/0375742 A1 Dec. 2, 2021

(51) Int. Cl.
*H01L 23/50* (2006.01)
*H01L 23/00* (2006.01)

(52) U.S. Cl.
CPC ............. *H01L 23/50* (2013.01); *H01L 24/80* (2013.01); *H01L 2924/14* (2013.01); *H01L 2924/151* (2013.01)

(58) Field of Classification Search
CPC ............................................. H01L 2224/0401
See application file for complete search history.

(56) References Cited

U.S. PATENT DOCUMENTS

| 2006/0160348 | A1* | 7/2006 | Pu | ......................... | H01L 24/05 257/E23.021 |
| 2016/0189980 | A1* | 6/2016 | Paek | ..................... | H01L 23/145 438/126 |
| 2019/0088608 | A1* | 3/2019 | Dadvand | ............... | H01L 21/288 |

* cited by examiner

*Primary Examiner* — Suberr L Chi
(74) *Attorney, Agent, or Firm* — Seyfarth Shaw LLP (57) ABSTRACT

An integrated circuit (IC) package is described. The IC package includes a die, having a pad layer structure on back-end-of-line layers on a substrate. The die also includes a metallization routing layer on the pad layer structure, and a first under bump metallization layer on the metallization routing layer. The IC package also includes a patterned seed layer on a surface of the die to contact the first under bump metallization layer. The IC package further includes a first package bump on the first under bump metallization layer.

12 Claims, 11 Drawing Sheets

REPURPOSED SEED LAYER FOR HIGH FREQUENCY NOISE CONTROL AND ELECTROSTATIC DISCHARGE CONNECTION

BACKGROUND

Field

Aspects of the present disclosure relate to integrated circuits and, more particularly, to a repurposed seed layer for high frequency noise control and electrostatic discharge connection.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art radio frequency (RF) mobile applications demand a small form factor, low cost, a tight power budget, and high electrical performance. RF package design has evolved to meet these divergent goals for enabling RF mobile applications that support communications enhancements such as 5G communications. These 5G RF mobile applications, however, are susceptible to near field noise, such as electromagnetic (EM) near field noise. Reducing EM near field noise in 5G RF mobile applications presents a significant challenge. In particular, the near field noise between a die and a package signal trace negatively impacts the design performance, potentially destroying the 5G RF mobile application.

SUMMARY

An integrated circuit (IC) package is described. The IC package includes a die, having a pad layer structure on back-end-of-line layers on a substrate. The die also includes a metallization routing layer on the pad layer structure, and a first under bump metallization layer on the metallization routing layer. The IC package also includes a patterned seed layer on a surface of the die to contact the first under bump metallization layer. The IC package further includes a first package bump on the first under bump metallization layer.

A method for fabricating a repurposed seed layer pattern is described. The method includes depositing a seed layer on a surface of a package wafer to contact a first under bump metallization layer of the package wafer. The method also includes forming a first package bump on the first under bump metallization layer of the package wafer. The method further includes etching exposed portions of the seed layer through a photoresist pattern on the seed layer to form a patterned seed layer to contact the first under bump metallization and the first package bump.

An integrated circuit (IC) package is described. The IC package includes a die, having a pad layer structure on back-end-of-line layers on a substrate. The die also includes means for routing on the pad layer structure, and a first under bump metallization layer on the routing means. The IC package also includes a patterned seed layer on a surface of the die to contact the first under bump metallization layer. The IC package further includes a first package bump on the first under bump metallization layer.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has substantially increased due to the large number of devices that are now interconnected in a modern electronic device.

These interconnections include back-end-of-line (BEOL) interconnect layers, which may refer to the conductive interconnect layers for electrically coupling to front-end-of-line (FEOL) active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels. The back-end-of-line interconnect layers may electrically couple to middle-of-line (MOL) interconnect layers, which interconnect to the front-end-of-line active devices of an integrated circuit.

State-of-the-art radio frequency (RF) mobile applications demand a small form factor, low cost, a tight power budget, and high electrical performance. RF package design has evolved to meet these divergent goals for enabling RF mobile applications that support communications enhancements such as 5G communications. For example, fan-out (FO) wafer level packaging (WLP) or FO-WLP process technology is a new development in packaging technology that is useful for 5G RF mobile applications. A chip first fan-out WLP process technology solution provides the benefit of having a conductive (e.g., copper (Cu)) plating directly on a conductive pad (e.g., aluminum pad (AP)) layer of a processor die, referred to as an AP pad or an AP pad layer (e.g. a pad layer structure).

This chip first fan-out WLP process technology solution provides flexibility to fan-in and fan-out connections from the processor die to a package ball. In addition, this solution also provides a height reduction of a first level interconnect between the processor die and the package balls of 5G RF mobile applications. These 5G RF mobile applications, however, are susceptible to near field noise, such as electromagnetic (EM) near field noise. Reducing EM near field noise in 5G RF mobile applications presents a significant challenge. In particular, the near field noise between the process die and the package balls negatively impacts the design performance, potentially destroying the 5G RF mobile application.

Various aspects of the present disclosure provide a repurposed seed layer electrostatic discharge (ESD) connection pattern. The process flow for fabrication of the repurposed seed layer ESD connection pattern may include a wafer level packaging (WLP) process technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an integrated circuit (IC) device. The terms "substrate," "wafer," and "laminate" may be used interchangeably. Similarly, the terms "chip" and "die" may be used interchangeably.

In chip first fan-out WLP process technology, a seed layer generally provides a die bump under bump metallization (UBM) process layer that can be etched and removed once the fabrication process is complete. According to aspects of the present disclosure, this seed layer is repurposed, using a small process change, to form a repurposed seed layer connection pattern. For example, the repurposed seed layer may provide an electrostatic discharge (ESD) connection pattern. This process change to form a repurposed seed layer ESD connection pattern can provide an isolation layer or a signal guard layer to improve current 5G RF package design. In particular, configuration of a repurposed seed layer to form a ground shield layer connection pattern isolates high frequency radiation noise between the package balls and the processor die.

Figure 1:
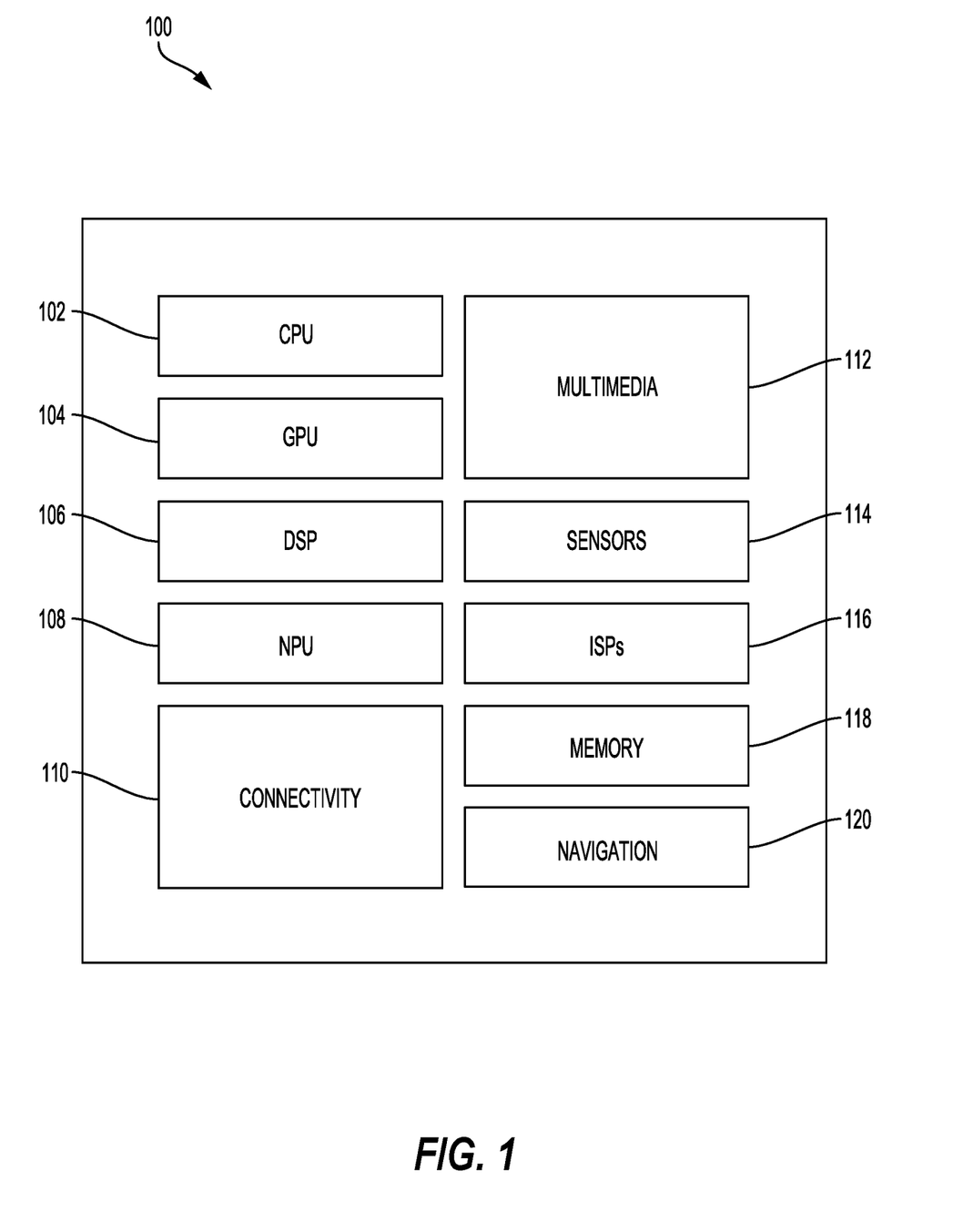
FIG. 1 illustrates an example implementation of a system-on-a-chip (SoC), including a repurposed seed layer electrostatic discharge (ESD) connection pattern, in accordance with certain aspects of the present disclosure.

FIG. 1 illustrates an example implementation of a host system-on-a-chip (SoC) 100, which includes a repurposed seed layer connection pattern, in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
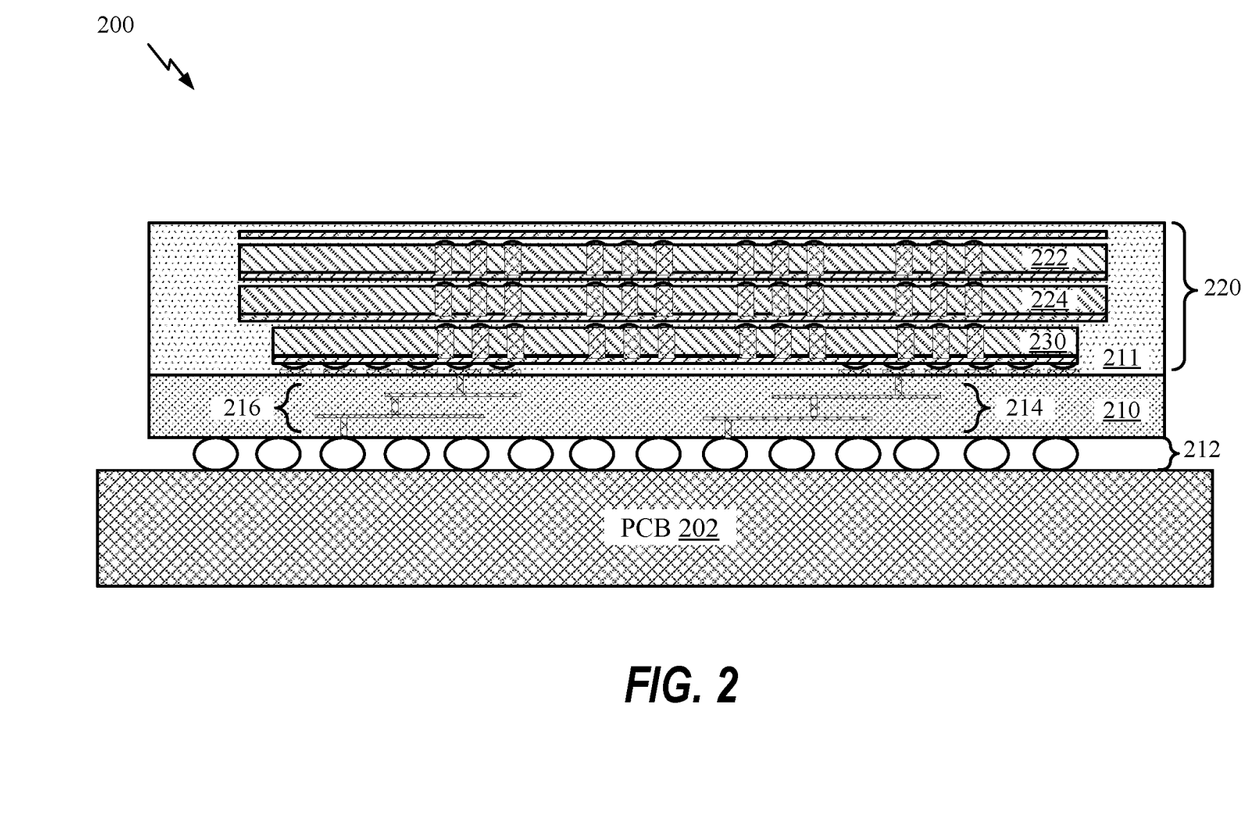
FIG. 2 shows a cross-sectional view of a stacked integrated circuit (IC) package, including the system-on-a-chip (SoC) of FIG. 1.

FIG. 2 shows a cross-sectional view illustrating a stacked integrated circuit (IC) package 200 of the SoC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SoC of FIG. 1.

Figure 3:
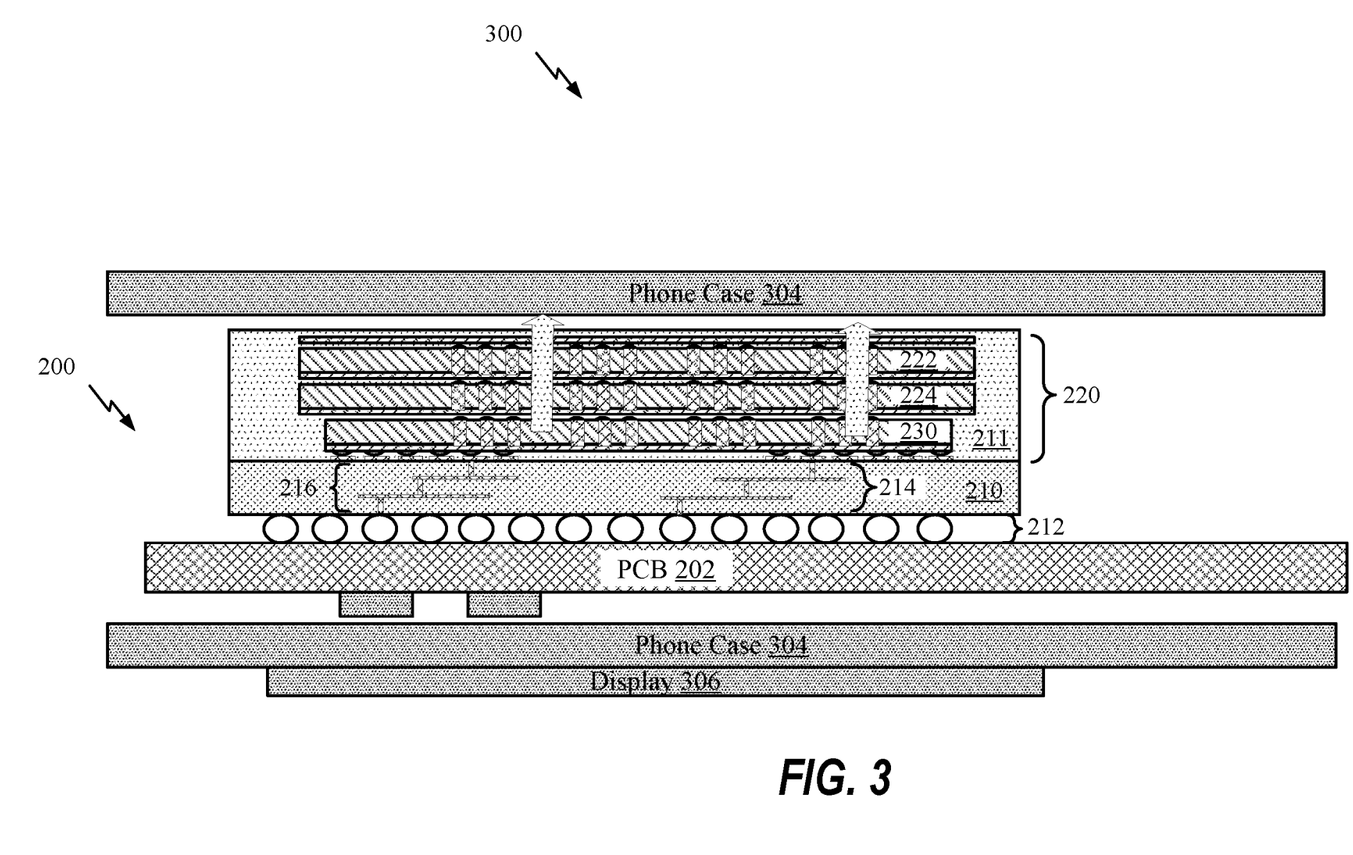
FIG. 3 shows a cross-sectional view illustrating the stacked integrated circuit (IC) package of FIG. 2, incorporated into a wireless device, according to one aspect of the disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a Smartphone, tablet, handheld device, or other limited form factor device configured for 5G communications. Representatively, the stacked IC package 200 is arranged within a phone case 304, including a display 306. In this configuration, repurposed seed layer connection patterns (not shown) are integrated into the stacked IC package 200, for example, as shown in FIG. 4.

Figure 4:
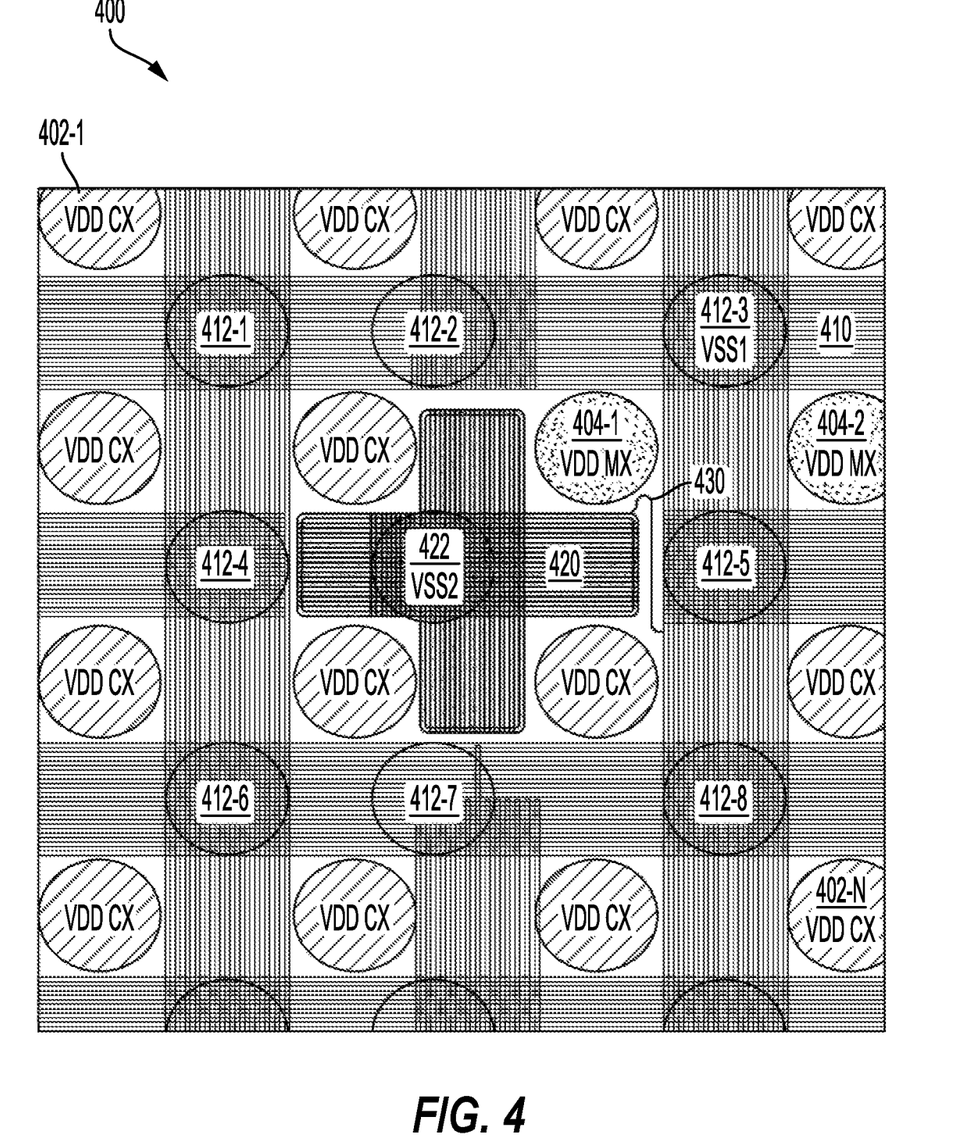
FIG. 4 is an overhead view of a layout of die package bumps having a repurposed seed layer electrostatic discharge (ESD) connection pattern, according to aspects of the present disclosure.

FIG. 4 is an overhead view of a radio frequency (RF) mobile package showing a layout of die package bumps having a repurposed seed layer connection pattern, according to aspects of the present disclosure. The overhead view of an RF mobile package 400 shows a layout of die package bumps, including package power bumps 402 (402-1, ..., 402-N) and package signal bumps 404 (404-1, 404-2). According to this aspect of the present disclosure, a first repurposed seed layer ground connection network 410 (e.g., a first network) and a second repurposed seed layer ground connection network 420 (e.g., a second network) are provided. The first repurposed seed layer ground connection network 410 (e.g., VSS1) includes first package ground bumps 412 (412-1, ..., 412-8) interconnected using a repurposed seed layer electrostatic discharge (ESD) connection pattern.

In one configuration, the second repurposed seed layer ground connection network 420 (e.g., VSS2) includes a second package ground bump 422, including a repurposed seed layer electrostatic discharge (ESD) connection pattern. In this configuration, an ESD connection trace 430 couples the first repurposed seed layer ground connection network 410 to the second repurposed seed layer ground connection network 420 to provide ESD connection. ESD connection is important for 5G RF product packages, such as the RF mobile package 400. A quality ESD connection includes higher inductance and resistance. Unfortunately, normal package traces provide a low quality ESD connection. This low quality ESD connection increases the package level noise and crosstalk, which causes a significant negative impact on the RF package design.

According to aspects of the present disclosure, the connection provided by the ESD connection trace 430 forms a ground shield layer that may beneficially isolate high frequency radiation noise from a package level to the process die. That is, the ground shield layer isolates near field noise between the package die bumps and the processor die without increasing a Z-height of the RF mobile package 400. In addition, the ground shield layer significantly reduces cross-talk, which may be caused by inductors formed on a package substrate. Furthermore, a width (e.g., 1 micrometer) of the ESD connection trace 430 is reduced relative to a width (e.g., 20 micrometers) for a conventional ESD shorting trace.

Figure 5:
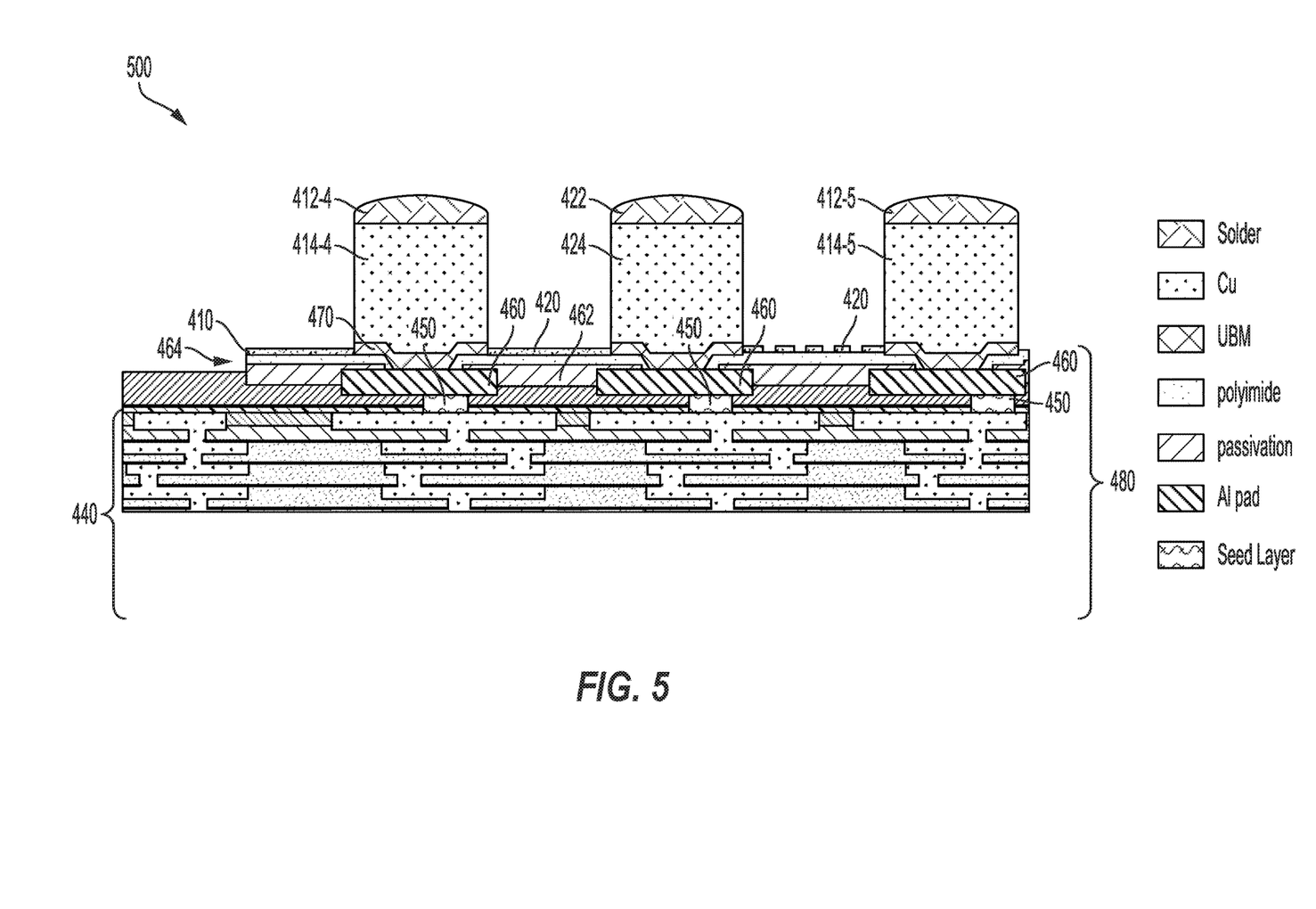
FIG. 5 is a cross-sectional diagram of a radio frequency (RF) mobile package, having the repurposed seed layer connection pattern of FIG. 4, according to aspects of the present disclosure.

FIG. 5 is a cross-sectional diagram of the radio frequency (RF) mobile package 400 of FIG. 4, having the repurposed seed layer connection pattern of FIG. 4, according to aspects of the present disclosure. In this configuration, an RF mobile package 500 includes an active substrate (not shown) and back-end-of-line (BEOL) layers 440 on a surface of the active substrate (not shown). The RF mobile package 400 further includes aluminum pad (AP) layer structures 450 on the BEOL layer 440. According to aspects of the present disclosure, the RF mobile package 500 includes an active die (not shown), such as a server die, an RF die, a mobile station modem, or other like active device.

The RF mobile package 500 further includes a metallization routing layer 460 (e.g., redistribution layers (RDLs)) to contact the AP layer structures 450. In addition, an under bump metallization layer 470 is on a second passivation layer 464 (e.g., polyimide) on a first passivation layer 462 on the surface of the metallization routing layer 460. The deposition of the second passivation layer 464 on the first passivation layer 462 completes formation of a package wafer 480 (e.g., a package die or a die after singulation). The under bump metallization layer 470 is coupled to pillars 414 (414-4, 424, 414-5), which may be composed of copper (Cu) to support the package bumps (e.g., 412-4, 422, 412-5), which may be composed of solder. According to this aspect of the present disclosure, a patterned seed/sacrificial conductive layer (e.g., 420) provides an additional packaging horizontal interconnect layer for providing an additional isolation layer.

In one configuration, the second repurposed seed layer ground connection network 420 (e.g., VSS2) contacts the under bump metallization layer 470 of the second package ground bump 422, in the repurposed seed layer electrostatic discharge (ESD) connection pattern. In addition, the first repurposed seed layer ground connection network 410 (e.g., VSS1) contacts the under bump metallization layer 470 of a first package ground bump (412-4), in a repurposed seed layer ESD connection pattern. The patterned seed/sacrificial conductive layer may be formed by plating a layer of copper (Cu) (e.g., 0.2 to 0.5 microns thick) on a layer of titanium (Ti) (e.g., 0.1 microns thick) on the second passivation layer 464. In one configuration, the patterned seed/sacrificial conductive layer may be formed by a plasma-enhanced chemical vapor deposition (PECVD) process. Although a ground connection network is described, a signal network as well as a power network are also contemplated according to aspects of the present disclosure.

FIGS. 6A-6I are cross-sectional diagrams illustrating a process of fabricating the RF mobile package 500 of FIG. 5, having a repurposed seed layer connection pattern of FIG. 4, according to aspects of the present disclosure. Although two types of repurposed seed layers are shown in FIG. 5, it should be recognized that any number of the repurposed seed layers (e.g., 420) may be used depending on the desired application, such as a processor die package.

Figure 6A:
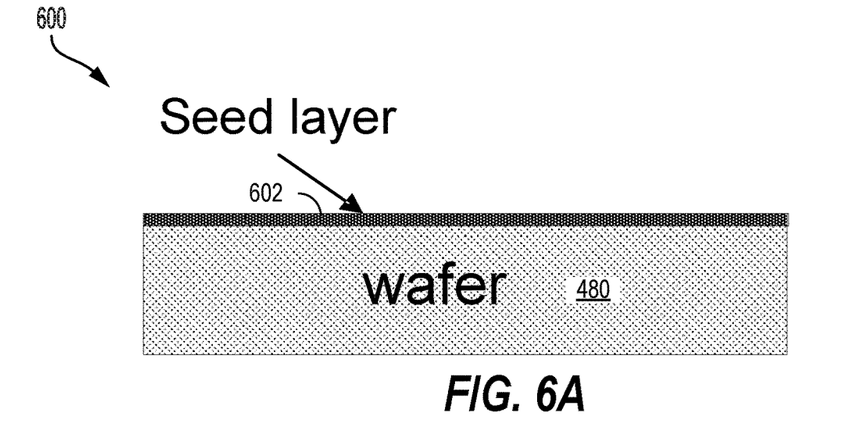
FIGS. 6A-6I are cross-sectional diagrams illustrating a process of fabricating the radio frequency (RF) mobile package of FIG. 5, having the repurposed seed layer connection pattern of FIG. 4, according to aspects of the present disclosure.

As shown in FIG. 6A, at step 600, a seed layer 602 is deposited on a surface of a package wafer 480. For example, the seed layer 602 is formed by plating a layer of copper (Cu) (e.g., 0.2 to 0.5 microns thick) on a layer of titanium (Ti) (e.g., 0.1 microns thick) on the surface of the package wafer 480.

Figure 6B:
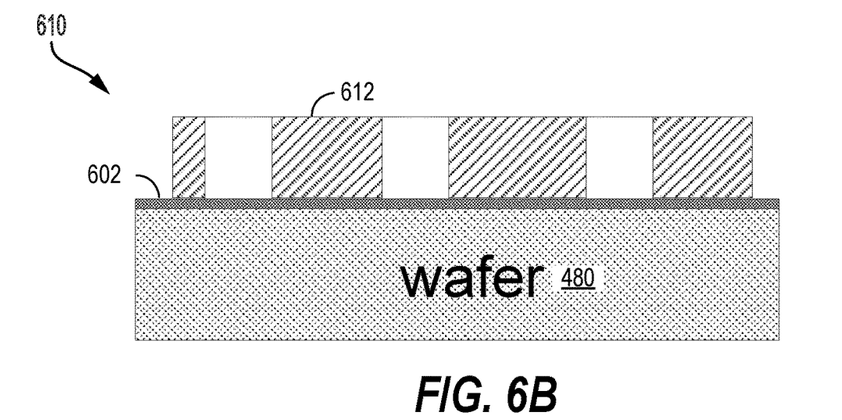

As shown in FIG. 6B, at step 610, a photoresist pattern 612 is formed on the seed layer 602, according to aspects of the present disclosure. Formation of the photoresist pattern 612 may include coating of a photoresist material on the seed layer 602. The photoresist material is exposed and developed using photolithography to define the photoresist pattern 612.

Figure 6C:
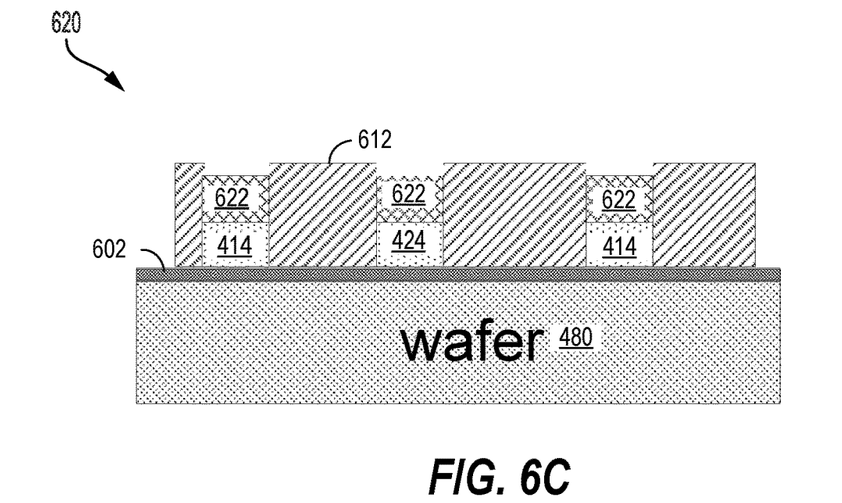

As shown in FIG. 6C, at step 620, an electroplating process is performed within the photoresist pattern 612 to form support pillars 414 and 424 which may be composed of copper (Cu). In addition, an alloy 622 (e.g., tin (Sn) and silver (Ag)) is electroplated onto the support pillars 414 and 424. The support pillars 414 and 424 may be formed by an electroplating process on an under bump metallization layer, such as the under bump metallization layer 470 shown in FIG. 5.

Figure 6D:
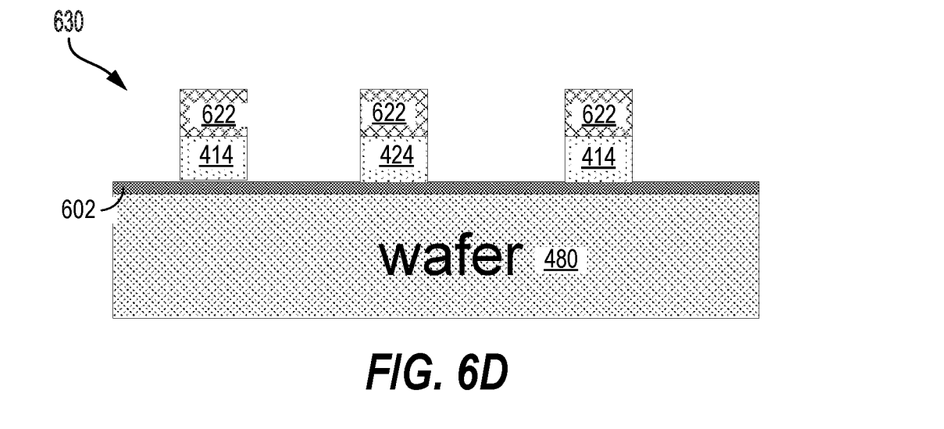
Figure 6E:
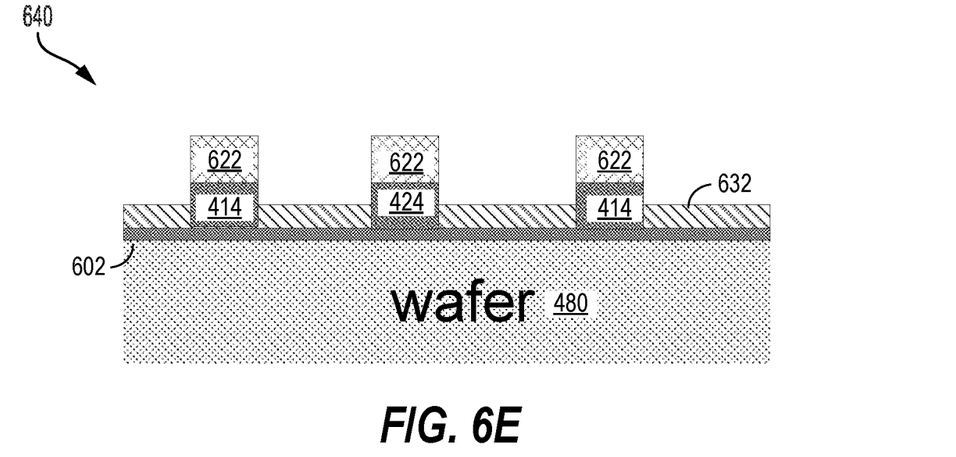

As shown in FIG. 6D, at step 630, the photoresist pattern 612 is stripped to expose portions of the seed layer 602. In addition, the support pillars 414 and 424 and the alloy 622 on the support pillars 414 and 424 are exposed. As shown in FIG. 6E, at step 640, a thin photoresist layer 632 is deposited on the exposed portions of the seed layer 602.

Figure 6F:
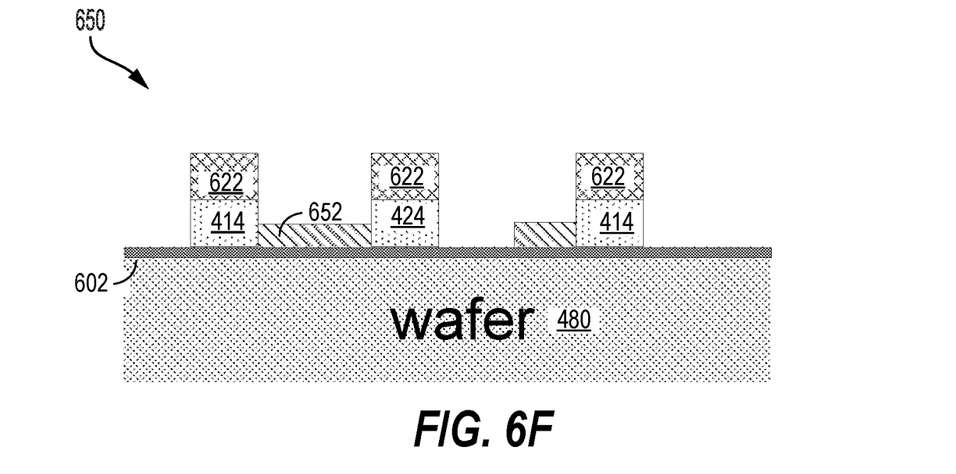

As shown in FIG. 6F, at step 650, a photoresist pattern 652 is formed on the seed layer 602, according to aspects of the present disclosure. Formation of the photoresist pattern 652 may include exposing and developing the thin photoresist layer 632 (shown in FIG. 6E) using photolithography to define the photoresist pattern 652 on the seed layer 602. In this example, the photoresist pattern 652 defines the portions of the seed layer 602 that are removed to form a patterned seed layer, according to aspects of the present disclosure.

Figure 6G:
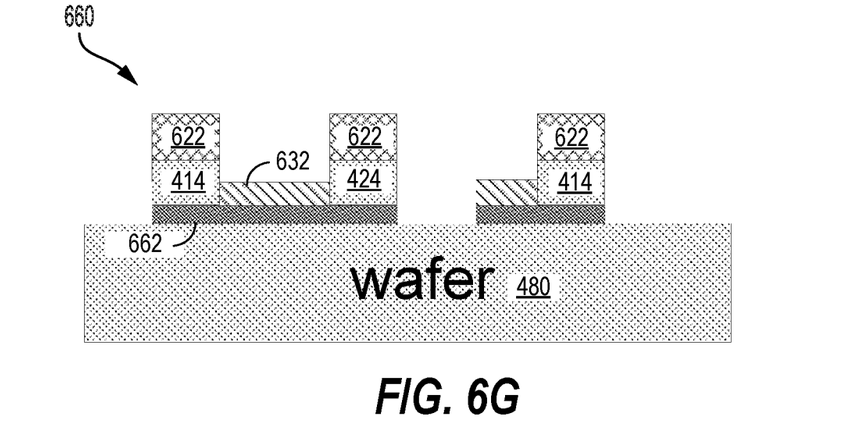
Figure 6H:
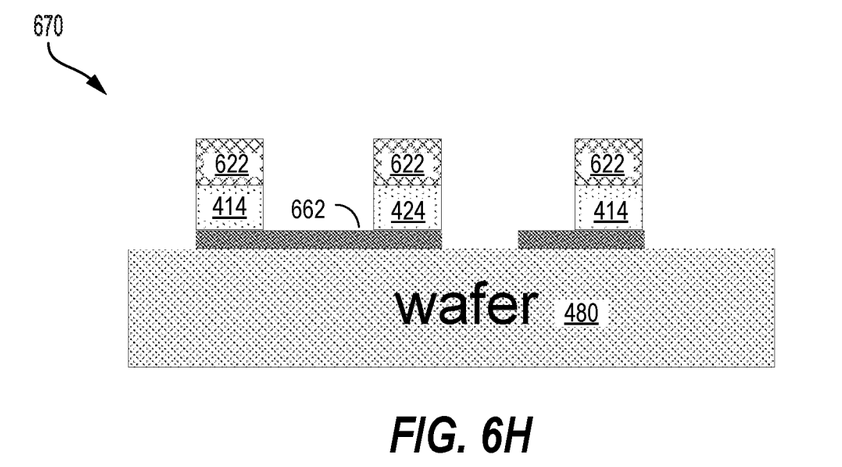
Figure 6I:
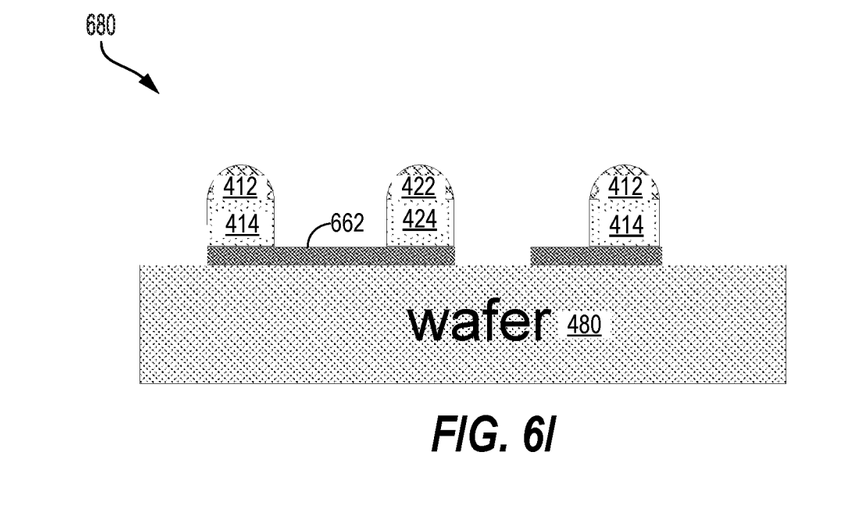

As shown in FIG. 6G, at step 660, the exposed portions of the seed layer 602 are etched to form a patterned seed layer 662, according to aspects of the present disclosure. Formation of the patterned seed layer 662 exposes portions of the package wafer 480 to isolate some of the pillars 414, while shorting others of the support pillars 414 and 424. As shown in FIG. 6H, at step 670, the photoresist pattern 652 is stripped. As shown in FIG. 6I, at step 680, the package wafer 480 is reflowed to form package bumps (e.g., 412 and 422) on the support pillars 414 and 424. That is, after flowing step 680, the support pillars 414 and 424 include the final package bumps (e.g., 412 and 422), which may be composed of the alloy 622 after reflow. According to this aspect of the present disclosure, the patterned seed layer 662 provides an additional packaging interconnect layer for an additional isolation layer. Singulation is then performed to complete the RF mobile package 500.

Figure 7:
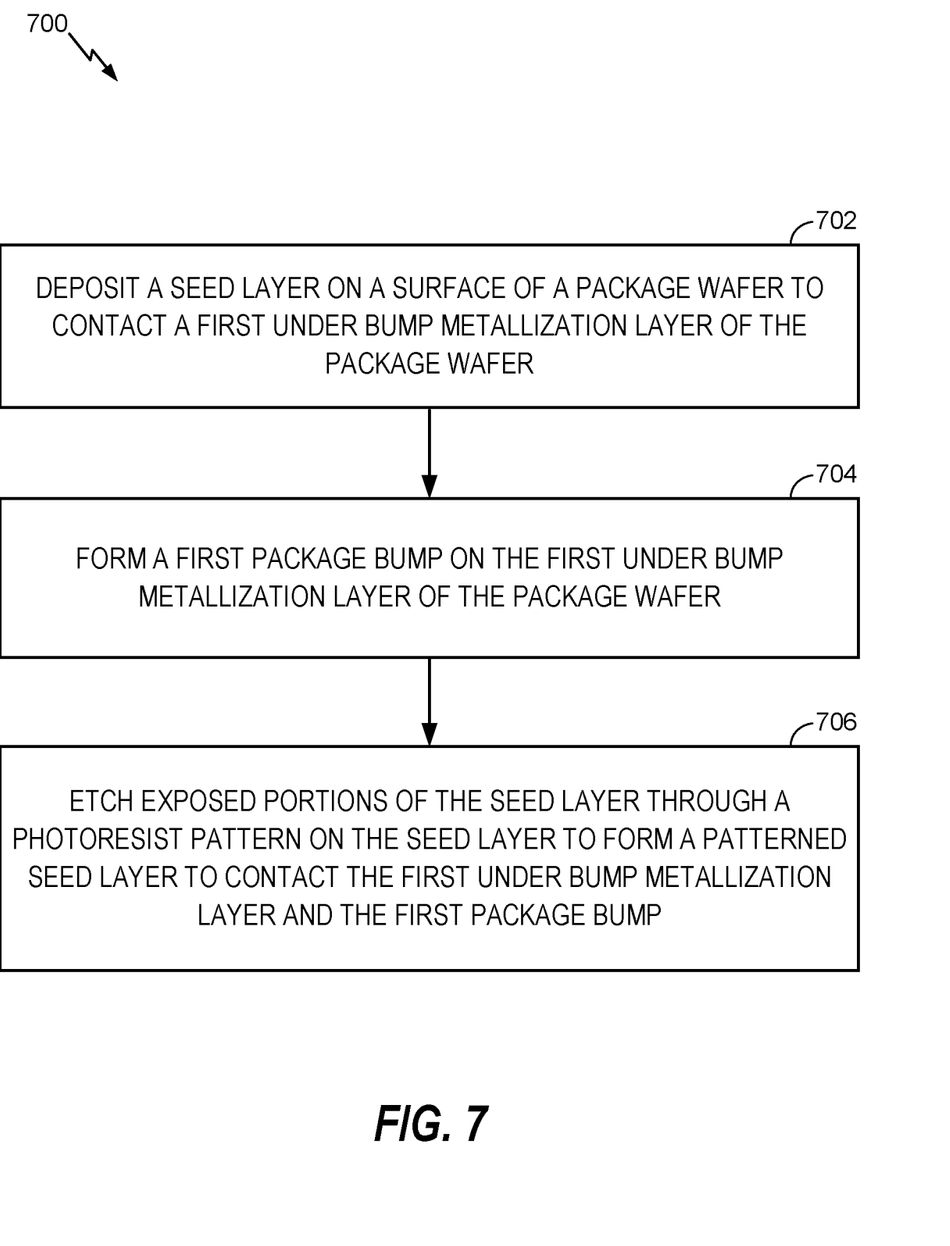
FIG. 7 is a process flow diagram illustrating a method for fabricating a repurposed seed layer pattern on a package wafer, according to an aspect of the present disclosure.

FIG. 7 is a process flow diagram illustrating a method for fabricating a repurposed seed layer pattern on a package wafer, according to an aspect of the present disclosure. A method 700 begins in block 702, in which a seed layer is deposited on a surface of a package wafer to contact a first under bump metallization layer of the package wafer. As shown in FIG. 6A, a seed layer 602 is deposited on a surface of the package wafer 480. For example, the seed layer 602 is formed by plating a layer of copper (Cu) (e.g., 0.2 to 0.5 microns thick) on a layer of titanium (Ti) (e.g., 0.1 microns thick) on the surface of the second passivation layer 464 on the package wafer 480, as shown in FIG. 5.

At block 704, a first package bump is formed on the first under bump metallization layer of the package wafer. For example, as shown in FIGS. 6A-6D, an electroplating process is performed within the photoresist pattern 612 to form support pillars 414 and 424, which may be composed of copper (Cu). In addition, an alloy 622 (e.g., tin (Sn) and silver (Ag)) is electroplated onto the support pillars 414 and 424. The support pillars 414 and 424 may be formed by an electroplating process on an under bump metallization layer, such as the under bump metallization layer 470 shown in FIG. 5.

At block 706, exposed portions of the seed layer are etched through a photoresist pattern on the seed layer to form a patterned seed layer to contact the first under bump metallization layer and the first package bump. For example, as shown in FIGS. 6G-6I, the exposed portions of the seed layer 602 are etched to form a patterned seed layer 662, according to aspects of the present disclosure. Formation of the patterned seed layer 662 exposes portions of the package wafer 480 to isolate some of the pillars 414, while shorting others of the support pillars 414 and 424. As shown in FIG. 6H, at step 670, the photoresist pattern 652 is stripped. As shown in FIG. 6I, at step 680, the package wafer 480 is reflowed to form package bumps (e.g., 412 and 422) on the support pillars 414 and 424.

The method 700 may also include depositing a first passivation layer on the metallization routing layer, and depositing a second passivation layer on the first passivation layer. For example as shown in FIG. 5, the deposition of the second passivation layer 464 on the first passivation layer 462 completes formation of a package wafer 480 (e.g., a package die or a die after singulation). The method 700 may further include forming a second under bump metallization on the second passivation layer to contact the metallization routing layer, and forming a second package bump on the second under bump metallization layer. For example as shown in FIG. 5, the under bump metallization layer 470 is on the second passivation layer 464 to enable formation of a second package bump (e.g., 412 or 422).

According to a further aspect of the present disclosure, an integrated circuit (IC) package includes a repurposed seed layer connection pattern. In one configuration, the IC package includes a die, having a pad layer structure on back-end-of-line layers on a substrate, means for routing on the pad layer structure, and a first under bump metallization layer on the routing means. In one configuration, the routing means may be the metallization routing layer 460, as shown in FIG. 4. In another aspect, the aforementioned means may be any structure or any material configured to perform the functions recited by the aforementioned means. (Completed after claim language approval).

Figure 8:
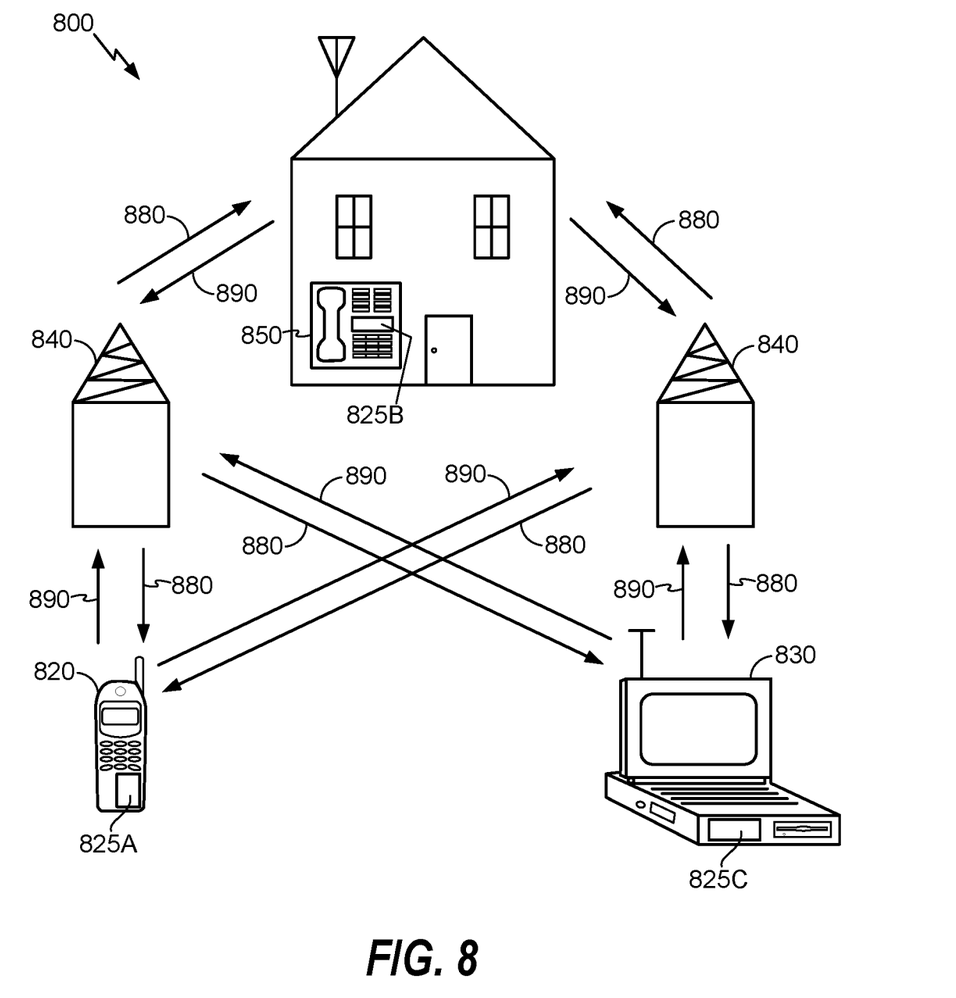
FIG. 8 is a block diagram showing an exemplary wireless communications system in which a configuration of the disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850, and two base stations 840. It will be recognized that wireless communications systems may have many more remote units and base stations. Remote units 820, 830, and 850 include IC devices 825A, 825B, and 825C that include the disclosed repurposed seed layer connection pattern. It will be recognized that other devices may also include the disclosed repurposed seed layer connection pattern, such as the base stations, switching devices, and network equipment. FIG. 8 shows forward link signals 880 from the base stations 840 to the remote units 820, 830, and 850, and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed repurposed seed layer connection pattern.

Figure 9:
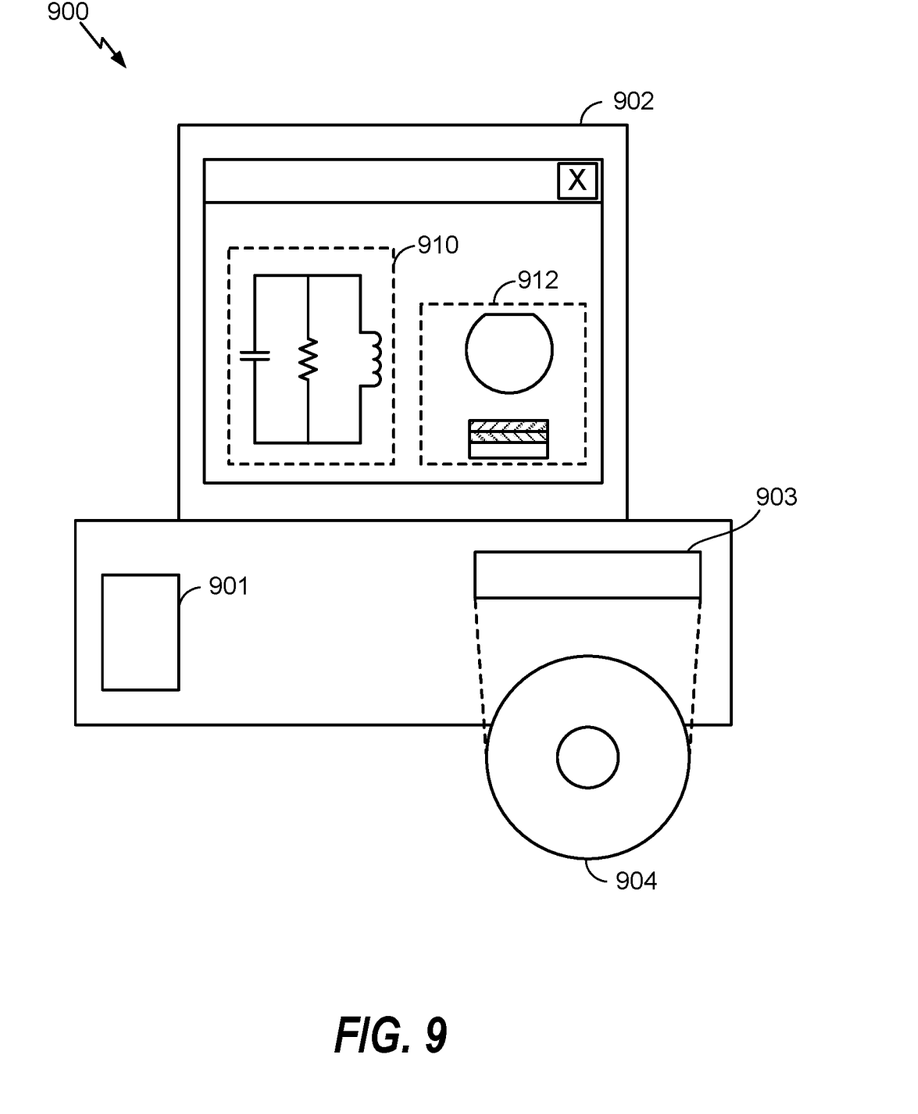
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912, such as a repurposed seed layer connection pattern. A storage medium 904 is provided for tangibly storing the design of the circuit 910 or the RF component 912 (e.g., the repurposed seed layer connection pattern). The design of the circuit 910 or the RF component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
    a die, including a pad layer structure on back-end-of-line layers on a substrate, a metallization routing layer on the pad layer structure, and a first under bump metallization layer on the metallization routing layer;
    a patterned seed layer on a surface of the die to contact the first under bump metallization layer;
    a first package bump on the first under bump metallization layer;
    a first passivation layer on the metallization routing layer;
    a second passivation layer on the first passivation layer;
    a second under bump metallization layer on the second passivation layer to contact the metallization routing layer;
    a second package bump on the second under bump metallization layer, in which the patterned seed layer couples the first under bump metallization layer to the second under bump metallization layer.

2. The IC package of claim 1, in which the first package bump coupled to the second package bump by the patterned seed layer provides a first network of the IC package.

3. The IC package of claim 2, in which the first network of the IC package comprises a signal network or a ground connection network.

4. The IC package of claim 2, further comprising a plurality of package ground bumps contacted by the patterned seed layer to form a second network of the IC package.

5. The IC package of claim 4, in which the first network comprises a signal network and the second network comprises a ground connection network.

6. The IC package of claim 4, further comprising:
    an electrostatic discharge trace to couple the first network to the second network to form an electrostatic discharge (ESD) ground connection network.

7. The IC package of claim 1, in which the first package bump comprises a copper (Cu) pillar bump.

8. The IC package of claim 1, in which the first package bump comprises a package ball.

9. An integrated circuit (IC) package, comprising:
    a die, including a pad layer structure on back-end-of-line layers on a substrate, means for routing on the pad layer structure, and a first under bump metallization layer on the routing means;
    a patterned seed layer on a surface of the die to contact the first under bump metallization layer;
    a first package bump on the first under bump metallization layer;
    a first passivation layer on the routing means;
    a second passivation layer on the first passivation layer;
    a second under bump metallization layer on the second passivation layer to contact the routing means;
    a second package bump on the second under bump metallization layer, in which the patterned seed layer couples the first under bump metallization layer to the second under bump metallization layer to short the first package bump to the second package bump.

10. The IC package of claim 9, in which the first package bump coupled to the second package bump by the patterned seed layer provides a first network of the IC package.

11. The IC package of claim 10, further comprising a plurality of package ground bumps contacted by the patterned seed layer to form a second network of the IC package.

12. The IC package of claim 11, further comprising:
    an electrostatic discharge trace to couple the first network to the second network to form an electrostatic discharge (ESD) ground connection network.

* * * * *